United States Patent
Kim

(10) Patent No.: US 7,262,995 B2
(45) Date of Patent: Aug. 28, 2007

(54) METHOD FOR READING FLASH MEMORY CELL, NAND-TYPE FLASH MEMORY APPARATUS, AND NOR-TYPE FLASH MEMORY APPARATUS

(75) Inventor: Ki Seog Kim, Ichon-shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 11/379,455

(22) Filed: Apr. 20, 2006

(65) Prior Publication Data

US 2006/0203551 A1    Sep. 14, 2006

Related U.S. Application Data

(62) Division of application No. 10/740,100, filed on Dec. 18, 2003, now Pat. No. 7,072,216.

(30) Foreign Application Priority Data

Jun. 30, 2003    (KR) ............................. 2003-43614

(51) Int. Cl.
*G11C 16/04* (2006.01)

(52) U.S. Cl. ...................... 365/185.17; 365/185.18; 365/185.21; 365/185.24

(58) Field of Classification Search ........... 365/185.17, 365/185.18, 185.21, 185.24
See application file for complete search history.

(56) References Cited

U.S. PATENT DOCUMENTS

| 5,351,212 | A | 9/1994 | Hashimoto |
| 5,991,202 | A * | 11/1999 | Derhacobian et al. . 365/185.19 |
| 6,175,522 | B1 * | 1/2001 | Fang .................... 365/185.18 |
| 6,266,280 | B1 | 7/2001 | Lee |
| 6,711,058 | B1 | 3/2004 | Hirano |
| 6,831,858 | B2 | 12/2004 | Hirano et al. |
| 7,072,216 | B2 | 7/2006 | Kim |

* cited by examiner

*Primary Examiner*—Connie C. Yoha
(74) *Attorney, Agent, or Firm*—Marshall, Gerstein & Borun LLP

(57) ABSTRACT

A method of reading a flash memory cell, a NAND-type flash memory apparatus, and/or a NOR-type flash memory apparatus improves the resolution capability and reduces the determination time by using different voltages applied at the read operation of the flash device. As a result, it is possible to reduce sizes of circuits such as a page buffer as well as the memory cell of the flash device.

7 Claims, 4 Drawing Sheets

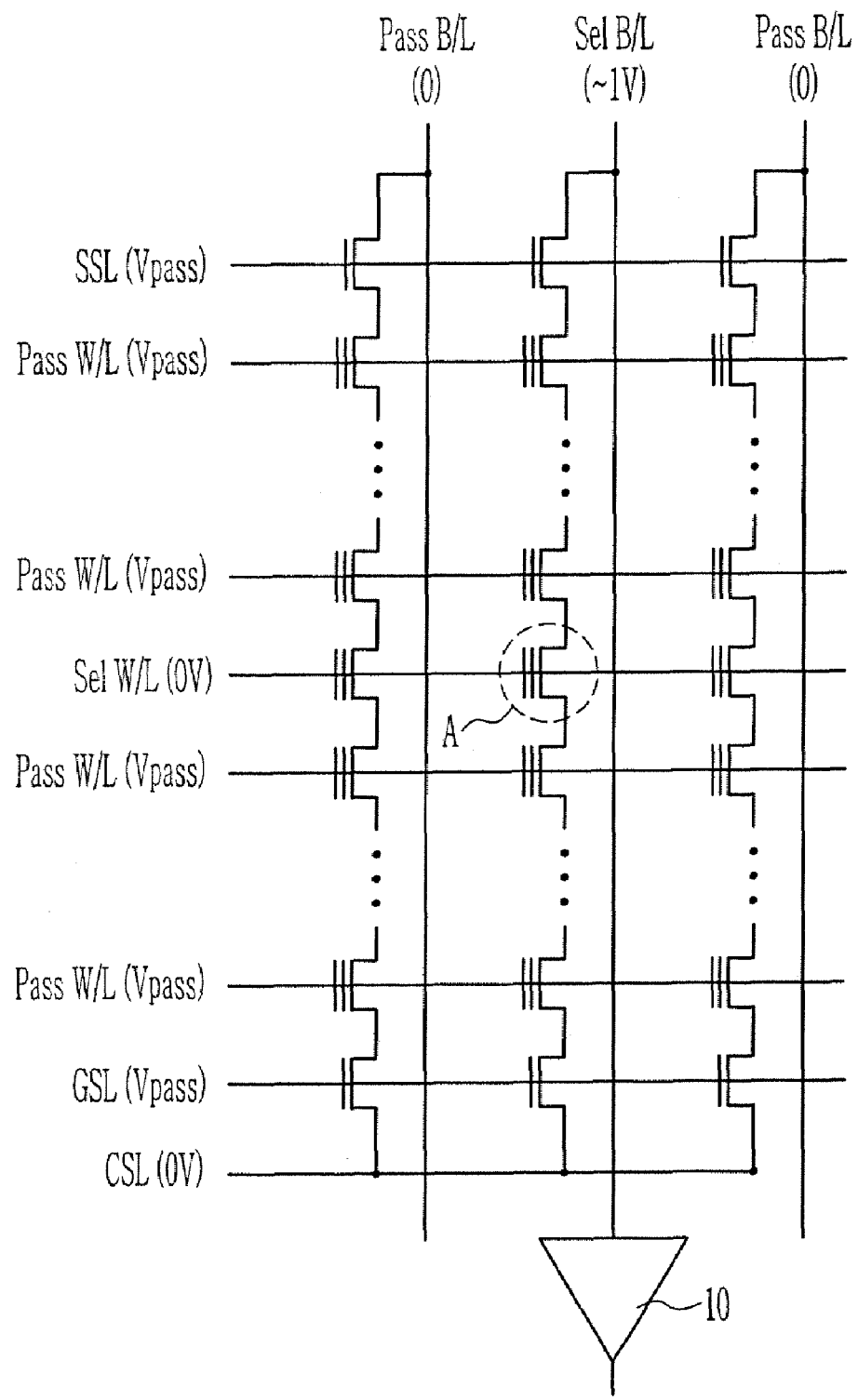

METHOD FOR READING FLASH MEMORY CELL, NAND-TYPE FLASH MEMORY APPARATUS, AND NOR-TYPE FLASH MEMORY APPARATUS

CROSS-REFERENCE TO RELATED APPLICATION

This patent is a divisional of U.S. patent application Ser. No. 10/740,100 filed Dec. 18, 2003 now U.S. Pat. No. 7,072,216.

TECHNICAL FIELD

This patent relates to a method of reading a flash memory cell, a NAND-type flash memory apparatus, and a NOR-type flash memory apparatus and, more specifically to a method of determining a programmed state or an erased state of a flash device.

DISCUSSION OF RELATED ART

In general, a method of reading a flash device uses the fact that a threshold voltage in a state where electrons are stored in a floating gate is about 1V and a threshold voltage in a state that holes are stored in the floating gate is −3V.

Now, the corresponding read operation in a conventional method will be described with reference to the drawings.

FIG. 1 is a circuit diagram for explaining a conventional method of reading a flash device.

FIGS. 2A and 2B are conceptual views for explaining a conventional method of reading a flash device.

FIG. 3 is a conceptual view illustrating a change of a voltage in accordance with a conventional method of reading a flash device.

For the sake of convenience, the description will be made based on the reading of a state of a cell A shown in FIG. 1. The cell A is referred to as an "A cell" or a "selected cell." A bit line and a word line connected to the selected cell are referred to as a "bit line Sel B/L" and a "word line Sel W/L," respectively. A non-selected bit line and a non-selected bit line are referred to as a "pass bit line Pass B/L" and a "pass word line Pass W/L."

Firstly, voltages applied to the respective lines to read the state of the A cell of the flash device will be described with reference to FIGS. 1, 2A, 2B, and 3. And then, the method of reading the state information of the flash memory cell.

In order to read the state of the A cell, a voltage of 1V is applied to the selected bit line Sel B/L, and a ground voltage of 0V is applied to the pass bit lines Pass B/L. In addition, a voltage of 0V is applied to the selected word line Sel W/L, and a pass voltage Vpass is applied to the pass word lines Pass W/L. A voltage of 0V is applied to the common source line. In other words, a voltage of 0V is applied to word lines sharing the selected cell, and a pass voltage is applied to word lines sharing the non-selected cells.

When the selected cell is in the erased state, the A cell is turned on to discharge the voltage charged in the selected bit line Sel B/L. In other words, the switch shown in FIG. 2B is turned on to discharge the voltage charged in the line. As shown FIG. 3, the discharged voltage is equal to a product of a cell current $I_{cell}$ flowing the selected cell and a determination time T divided by a line capacitance C (see line E1 in FIG. 3). The corresponding voltage drop is represented as $I_{cell} \times T/C$.

On the other hand, when the selected cell is in the programmed state, the A cell is turned off to maintain the voltage of the selected bit line Sel B/L at the level of the charged voltage. In other words, the switch shown in FIG. 2B is turned off to maintain the voltage of the line at the level of the charged voltage. As shown in the dotted line in FIG. 3, it is necessary that the selected bit line Sel B/L is maintained at the voltage (charged voltage) of 1V (see the dotted line in FIG. 3). However, in the selected bit line Sel B/L, a certain voltage is discharged due to leakage currents of the other devices that are connected to the bit line Sel B/L, (see line P1 in FIG. 3). Namely, when the selected cell is in the programmed state for preventing the current from flowing, as shown in FIG. 3, there is the discharge phenomenon of the voltage corresponding to a product of the leakage current $I_{leak}$ and a determination time T divided by a line capacitance C. The corresponding voltage drop due to the current leakage of the devices connected to the selected bit line Sel B/L is represented as $I_{leak} \times T/C$.

As shown in FIG. 3, the discharge phenomenon exists due to the current leakage of the other devices connected to the line even in the programmed state as well as in the erased state of the selected cell. As a result, the so-called information resolution capability of the cell is lowered, and performance of the flash device is lowered due to delay of determination time. Therefore, the competitiveness of products is weakened. In addition, there is another problem that the leakage current is generated in an information determination unit itself as well as non-selected array. In a highly integrated device, suppression of the leakage current has been a matter of great concern.

SUMMARY OF THE INVENTION

A method for reading a flash memory cell, an NAND-type flash memory apparatus, and/or an NOR-type flash memory apparatus, in which different voltages are applied at the read operation of the flash device, so that it is possible to improve the resolution capability and reduce the determination time and also it is possible to reduce sizes of transistors constituting the cell and an information determination unit.

Furthermore, a method for reading a flash memory cell having a gate terminal, a drain terminal, and a source terminal may include applying a channel voltage to the gate terminal, applying a read voltage to the drain terminal, and applying a power supply voltage to the source terminal, wherein the channel voltage is lower than a threshold voltage of the cell in a programmed state and higher than a threshold voltage of the cell in an erased state, wherein the read voltage is lower than the power supply voltage and higher than a ground voltage; and reading information stored in the cell by comparing a voltage of the drain terminal with a reference voltage.

Alternatively, a method for reading an NAND-type flash memory apparatus having a plurality of cell strings, each of which a plurality of cells is serially connected to, a plurality of bit lines, each of which is connected to a common drain terminal of the corresponding cell string to select the cell strings, a common source line connected to a common source terminal of the cell strings, a plurality of word lines intersecting the bit lines to select the respective cells may include selecting a cell to read a state thereof by selecting the corresponding bit line and the corresponding word line; applying a ground voltage to the selected word line, applying a pass voltage to the other non-selected word lines, applying a read voltage to the selected bit line, applying a power supply voltage to the other non-selected bit lines, and applying the power supply voltage to the common source line, wherein the read voltage is lower than the power supply voltage and higher than the ground voltage; and reading information stored in the selected cell by comparing a voltage of the selected bit line with a reference voltage.

In an alternate example, a method of reading an NOR-type flash memory apparatus having a plurality of word lines, a plurality of bit lines intersecting the plurality of the word lines, a plurality of cells connected between the bit lines and the word lines, and a common source line connected to source terminals of the plurality of the cells may include selecting a cell to read a state thereof by selecting the corresponding bit line and the corresponding word line; applying a channel voltage to the selected word line, applying a ground voltage to the other non-selected word lines, applying a read voltage to the selected bit line, applying a power supply voltage to the other non-selected bit lines, and applying the power supply voltage to the common source line, wherein the channel voltage is lower than a threshold voltage of the selected cell in a programmed state and higher than a threshold voltage of the selected cell in an erased state, and wherein the read voltage is lower than the power supply voltage and higher than the ground voltage; and reading information stored in the selected cell by comparing a voltage of the selected bit line with a reference voltage.

BRIEF DESCRIPTION OF THE DRAWINGS

The aforementioned aspects and other features of the present invention will be explained in the following description, taken in conjunction with the accompanying drawings, wherein:

FIG. 1 is a circuit diagram for explaining a conventional method of reading a flash device;

DETAILED DESCRIPTION OF PREFERRED EMBODIMENTS

Figure 2A:
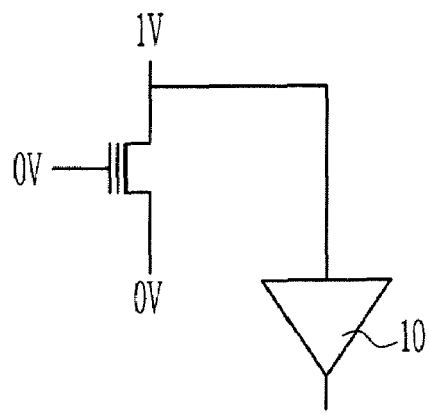
FIGS. 2A and 2B are conceptual views for explaining a conventional method of reading a flash device.
Figure 2B:
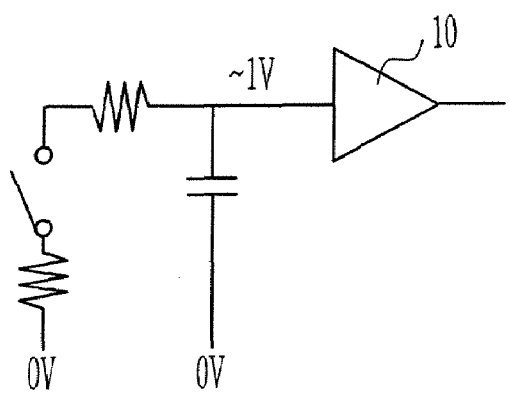

Now, several embodiments will be described in detail with reference to the accompanying drawings. However, the invention is not limited to the herein described embodiments. The invention can be modified in various forms. The described embodiments of the are only provided to explain more clearly the invention to the ordinarily skilled in the art of the invention. In the accompanying drawings, like reference numerals are used to indicate like components.

The state information determination on the selected flash memory cell may be as follows. A channel voltage is applied to a gate terminal of the cell, and a power supply voltage is applied to a source terminal of the cell. In addition, the drain terminal is charged with a read voltage. The state of the device is determined by a change of the read voltage charged at the drain terminal. Specifically, when the voltage of the drain terminal is maintained at the read voltage or when a predetermined voltage is dropped, the cell is read as a programmed state. When the voltage of the drain terminal is higher than the read voltage, the cell is read as an erased state. In this method of reading the flash memory cell, various types of reference voltages may be used to determine the read voltage charged at the drain terminal. A voltage lower than the threshold voltage of the cell in the programmed state and higher than the threshold voltage of the cell in the erased state may be used as the channel voltage. The aforementioned read voltage, an external reference voltage, or a voltage of the adjacent bit line may be used as the reference voltage. A voltage between the power supply voltage and the ground voltage may be used as the read voltage.

The above-described state information determination method of the flash memory cell may be adapted to any flash memory apparatuses having various array structures. More specifically, the method may be adapted to a flash memory apparatus having a NAND-type array structure or a NOR-type array structure. The method may be adapted to the NOR-type flash memory apparatus or the NAND-type flash memory apparatus based on which one of the unit cell and the string shares the voltage charged at the bit line.

In brief, a method of reading the flash memory apparatus may be implemented as follows.

In case of a flash memory apparatus in an NOR-type array structure having a plurality of word lines, a plurality of bit lines intersecting the plurality of the word lines, a plurality of cells connected between the bit lines and the word lines, and a common source line connected to source terminals to the plurality of the cells, the cell of which state information is read is selected by selecting the bit line and the word line. The channel voltage is applied to the selected word line, and the ground voltage is applied to the non-selected word line. The read voltage is applied to the selected bit line, so that the selected bit line is charged at the read voltage. The power supply voltage is applied to the non-selected bit line. The power supply voltage is also applied to the common source line. The voltage of the bit line is compared with a predetermined reference voltage. When the read voltage charged in the selected bit line is equal to or lower than the reference voltage, the cell is read as the programmed state. When the read voltage charged in the selected bit line is higher than the reference voltage, the cell is read as the erased state.

The channel voltage is a voltage of 3V to 5V, preferably 4V. As the read voltage, a voltage between the power supply voltage and the ground voltage is used, and preferably, a voltage dropped due to the leakage current which is generated at the selected bit line or a voltage of 2/3×Vcc is used. More preferably, a voltage of 1V or Vcc/2 is applied as the read voltage. As the reference voltage, one of the read voltage, an external reference voltage, and the voltages of the adjacent bit lines may be used.

In case of a flash memory apparatus in an NAND-type array structure having a plurality of cell strings, each of which a plurality of cells is serially connected to, a plurality of bit lines, each of which is connected to a common drain terminal of the corresponding cell string to select the cell strings, a common source line connected to a common source terminal of the cell strings, a plurality of word lines intersecting the bit lines to select the respective cells, the cell of which state information is read is selected by selecting the bit line and the word line. The channel voltage is applied to the selected word line, and the pass voltage is applied to the non-selected word line. The read voltage is applied to the selected bit line, so that the selected bit line is charged at the read voltage. The power supply voltage is applied to the non-selected bit line. The power supply voltage is also applied to the common source line. The voltage of the bit line is compared with a predetermined reference voltage. When the read voltage charged in the selected bit line is equal to or lower than the reference voltage, the cell is read as the programmed state. When the read voltage charged in the selected bit line is higher than the reference voltage, the cell is read as the erased state.

The channel voltage is a voltage of −2V to 2V, preferably 0V. As the read voltage, a voltage between the power supply voltage and the ground voltage is used, and preferably, a voltage dropped due to the leakage current which is generated at the selected bit line or a voltage of 2/3×Vcc is used. More preferably, a voltage of 1V or Vcc/2 is applied as the read voltage. As the pass voltage, a voltage which is higher than the threshold voltage of the programmed cell is used, and more preferably, a voltage of 4V to 5V is used. As the reference voltage, one of the read voltage, an external reference voltage, and the voltages of the adjacent bit lines may be used.

A method of reading the flash memory may be understood from the following description illustrating the read operation of the NAND-type flash memory apparatus with reference to the drawings.

Figure 4:
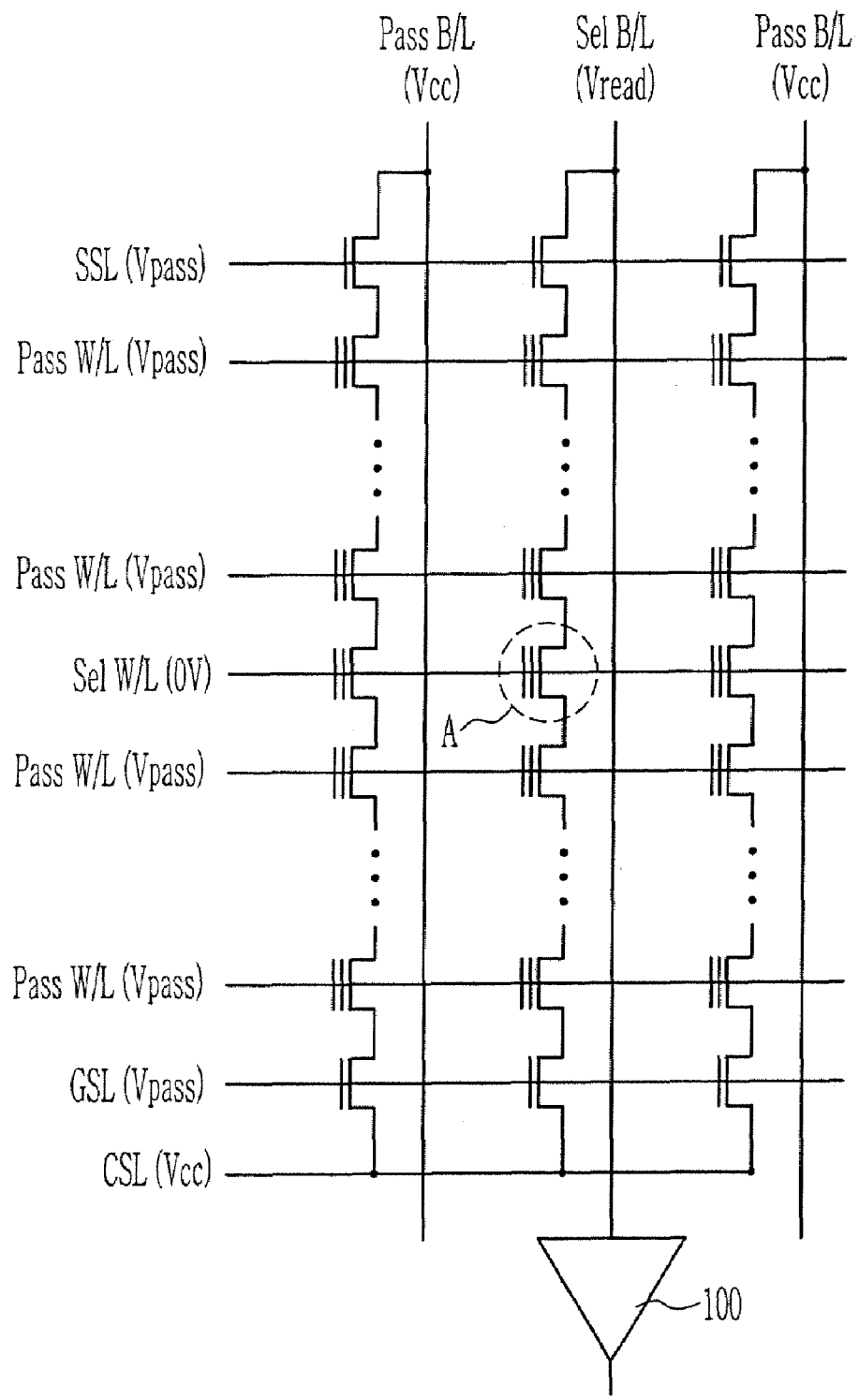
FIG. 4 is a circuit diagram for explaining a method of reading a flash device in accordance with the present invention.

FIG. 4 is a circuit diagram for explaining the method of reading the flash device in accordance with the present invention.

Figure 5A:
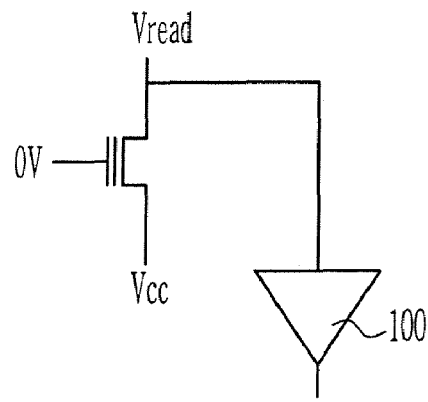
FIGS. 5A and 5B are conceptual views for explaining a method of reading a flash device in accordance with the present invention.
Figure 5B:
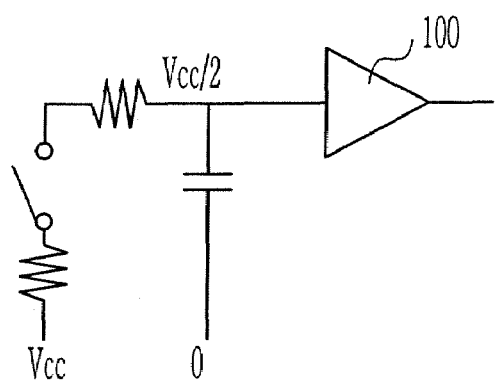

FIGS. 5A and 5B are conceptual views for explaining the method of reading the flash device in accordance with the present invention.

Figure 6:
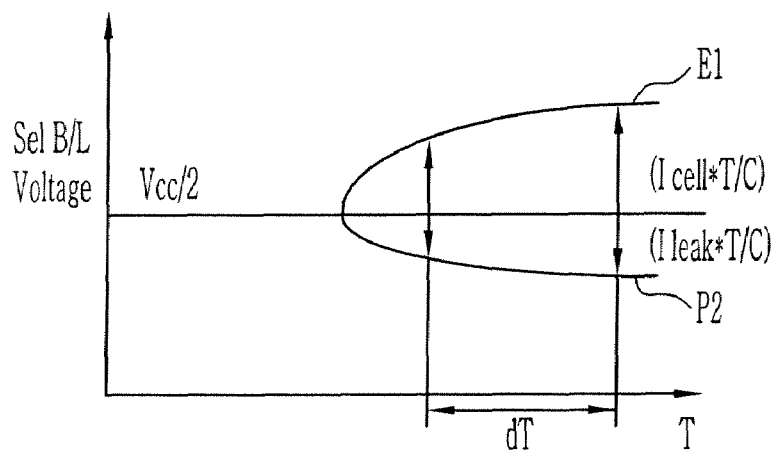
FIG. 6 is a schematic diagram illustrating a change of a voltage in accordance with a method of reading a flash memory of the present invention.

FIG. 6 is a conceptual view illustrating a change of a voltage in the method of reading the flash device in accordance with the present invention.

With reference to FIGS. 4, 5A, 5B, and 6, voltages applied to the respective lines to read the state of the A cell of the NAND-type flash device will be described, and then, the method of reading the cell in both of the programmed and erased states will be described based on the description of the voltages.

Firstly, referring to FIG. 4, the array structure of the NAND-type flash memory apparatus in accordance with an embodiment of the present invention is as follows. The array structure comprises one to M cell blocks of which one to N flash memory cells are connected in a shape of a string, one to M bit lines which are connected to drain terminals of the cell blocks, one to N word lines which are connected to gate terminals of the flash memory cells in the cell blocks, and a common source line which is connected to the source terminals of the cell blocks.

In addition, bit line selection transistors driven by bit line selection lines (string selection lines; SSL) may be further provided between the drain terminals of the cell blocks and the bit lines. Source line selection transistors driven by source line selection lines (ground selection line; GSL) may be further provided between the source terminals of the cell blocks and the common source line. A determination unit connected to the bit lines may be further provided in order to determine the state of the selected cell by comparing the voltages of the bit lines to the reference voltage.

Since the above described array structure is an example for explaining the NAND-type flash memory apparatus in accordance with the embodiment of the present invention, the method of reading the flash memory cell in accordance with the present invention is not limited to the array structure, and thus, the present invention can be adapted to various types of flash memory apparatuses.

In order to read the state information of the A cell, a ground voltage Vss, that is, 0V is applied to the gate terminal of the A cell, a read voltage Vread is applied to the drain terminal of the A cell, and a power supply voltage Vcc is applied to the source terminal of the A cell as shown in FIG. 5A. After the aforementioned voltages are applied to the respective nodes, the state of the read voltage Vread is determined to read the state information of the A cell. In the application of the aforementioned voltages to the nodes of the A cell, the voltages in the following Table 1 are applied in the NAND type flash memory apparatus.

The following Table 1 shows voltage applied to the flash device in the read operation in accordance with the present invention.

TABLE 1

|  | Pass B/L | Sel B/L | SSL | Pass W/L | Sel W/L | GSL | CSL | BULK |
|---|---|---|---|---|---|---|---|---|
| Voltage (V) | Vcc | Vcc/2 | Vpass | Vpass | 0 | Vpass | Vcc | 0 |

Referring to Table 1, a voltage of 0V is applied to the word lines Sel W/L that share the selected cell, and a pass voltage Vpass is applied to the word lines Pass W/L that do not share the non-selected cell. A half of the power supply voltage, that is, Vcc/2 is applied to the selected bit line Sel B/L, and the power supply voltage Vcc is applied to the non-selected bit line Pass B/L. In addition, the pass voltage Vpass is applied to the string select line SSL and the ground select line GSL, and the power supply voltage Vcc is also applied to the common source line CSL. A voltage of 0V is applied to the substrate BULK.

A method of reading the state information of the selected cell by applying the aforementioned voltages may be implemented as follows.

When the selected cell is in the programmed state, the A cell is turned off to maintain the voltage of the selected bit line Sel B/L at the level of read voltage Vread. In other words, as the switch shown in FIG. 5B is turned off, the programmed A cell has a function of maintaining the voltage charged in the line, that is, the read voltage. As shown in the dotted line in FIG. 6, it is necessary that the selected bit line be maintained at the read voltage. However, in the selected bit line Sel B/L, a certain voltage is discharged due to the leakage current of the other devices, which are connected to the bit line Sel B/L. Therefore, when the cell is in the programmed state, the read voltage, that is, the line voltage charged in the selected bit line Sel B/L is dropped by a predetermined voltage due to the discharge phenomenon (see line E2 in FIG. 6). The read voltage Vread applied to the selected bit line Sel B/L is dropped by a voltage of $I_{leak} \times T/C$.

When the selected cell is in the erased state, the A cell is turned on to raise the read voltage Vread charged in the selected bit line Sel B/L. In other words, as the switch shown in FIG. 5B is turned on, the read voltage, that is, the voltage charged in the line is raised due to the charge supplied by the common source line CSL. As a result, as shown in FIG. 6, the read voltage Vread is raised by a product of the cell current $I_{cell}$ and the determination time T divided by the line capacitance C (see line E1 in FIG. 6). The read voltage Vread applied to the selected bit line Sel B/L is raised by a voltage of $I_{cell} \times T/C$.

Figure 3:
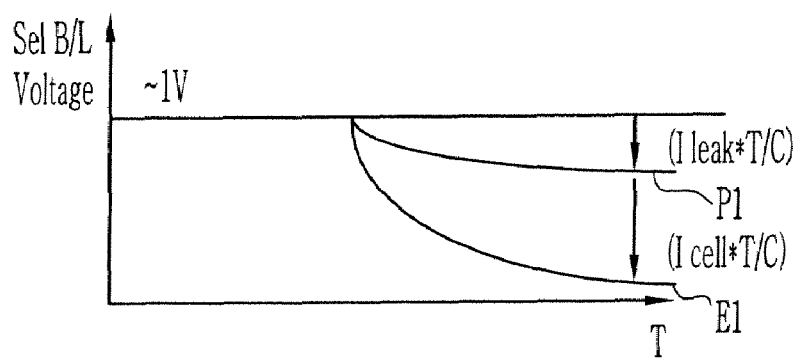
FIG. 3 is a conceptual view illustrating a change of a voltage in accordance with a conventional method of reading a flash device.

In the conventional method of reading the cell, the change of the voltage of the selected bit line Sel B/L has the same tendency irrespective of the state of the cell. In other words, in the erased state, the voltage is dropped due to the selected cell (see line E1 in FIG. 3), and in the programmed state, the voltage is also dropped due to the leakage current (see line P1 in FIG. 3). However, in the present invention, the change of the voltage of the selected bit line Sel B/L has a different tendency depending on the state of the cell. In other words, in the erased state, the voltage is raised due to the selected cell and the voltage applied to the source (see line E2 in FIG. 6), but in the programmed state, the voltage is dropped due to the leakage current (see line P2 in FIG. 6). Namely, the read voltage, that is, the voltage charged in the selected bit line Sel B/L is discharged and charged in the erased state and the programmed states, respectively.

The difference between the read voltages in the eased and programmed states according to the present invention is $(I_{leak}+I_{cell}) \times T/C$. Therefore, the information determination resolution capability of the cell can be improved. In addition, the time required for the information determination can be sufficiently reduced. The reduction rate of the determination time is as follows: $dT/T=2 \times I_{leak}/[(I_{cell}+I_{leak}) \times (I_{cell}-I_{leak})]$. The reduction rate can be improved by dT, as shown in FIG. 6A. Herein, $dT=C/(I_{leak}+I_{cell})-C/(I_{cell}-I_{leak})$, and $T=CV/(I_{cell}-I_{leak})$.

For example, in a case where the leakage current of the line is 100 nA and the current flowing the erased cell is 900 nA, the determination time can be improved by 10% (=100÷1000×100). Whereas the leakage current generated at the read operation deteriorates the information determination capability in the conventional method, the leakage current improves the information determination capability in the present invention. In other words, as the leakage current is increased, the determination capability and time can be improved. If the sensible current is 200 nA, the leakage current can be distinguished up to 100 nA. As a result, even in the worst case, the voltage can be estimated up to 0.5V. Therefore, the conventional problem that the leakage current is the limitation in the reduction of sizes of the device is solved, so that a high integration density of device can be implemented. In addition, it is possible to reduce the sizes of the transistors constituting the cell and the information determination unit and the area of circuits such as a page buffer, so that the chip size can be reduced and the number of chips per one wafer can be increased. In addition, it is possible to improve the so-called sensing margin and to prevent the error of the information determination. And also, it is possible to reduce the size of the determination unit by the capability of increasing the leakage current. Furthermore, the size of the line decoder can be more improved due to the improvement of the information determination capability. Moreover, it is possible to minimize the leakage current by applying the same level of the voltage to the non-selected bit line as that of the voltage applied to the common source line. As a result, the sensing rate of the device can be remarkably improved.

In addition, whereas in the conventional determination method the erased cell is detected as the "0" state and the programmed cell is detected as the "1" state, in the present invention the contrary states are detected. By doing so, the components for the purpose of detection in the flash device of the present invention may be changed.

A method of determining the state of the flash memory cell based on the formation of the channel in accordance with the state of the cell may be implemented as follows. The case that the channel voltage, the read voltage, and the powers supply voltage are applied to the gate, drain, and source terminals of the flash memory cell, respectively, is considered. When the flash memory cell is in the erased state, a predetermined channel is generated by the channel voltage, so that the voltage of the drain terminal can be raised by the power supply voltage of the source terminal having the high voltage level. On the other hand, when the flash memory cell is in the programmed state, any channel is not generated, so that the read voltage applied to the drain terminal may be maintained or a predetermined voltage may be dropped due to the leakage current.

As described above, according to the present invention, it is possible to improve the resolution capability and reduce the determination time by different voltages applied at the read operation of the flash device.

In addition, according to the present invention, it is possible to reduce the size of circuit such as a page buffer as well as the flash memory device by using the leakage current generated in the read operation as a factor capable of improving the resolution capability and reducing the determination time.

What is claimed is:

1. A method for reading an NAND-type flash memory apparatus having a plurality of cell strings, each of which a plurality of cells is serially connected to, a plurality of bit lines, each of which is connected to a common drain terminal of the corresponding cell string to select the cell strings, a common source line connected to a common source terminal of the cell strings, a plurality of word lines intersecting the bit lines to select the respective cells, comprising the steps of:

selecting a cell to read a state thereof by selecting the corresponding bit line and the corresponding word line;

applying a ground voltage to the selected word line, applying a pass voltage to the other non-selected word lines, applying a power supply voltage to the other non-selected bit lines, applying a read voltage to the selected bit line, and applying the power supply voltage to the common source line, wherein the read voltage is lower than the power supply voltage and higher than the ground voltage; and reading information stored in the selected cell by comparing a voltage of the selected bit line with a reference voltage.

2. The method for reading an NAND-type flash memory apparatus according to claim 1, wherein the selected cell is read as a programmed state when the read voltage applied to the selected bit line is equal to or lower than the reference voltage, and wherein the selected cell is read as an erased state when the read voltage applied to the selected bit line is higher than the reference voltage.

3. The method of reading a NAND-type flash memory apparatus according to claim 1, wherein the read voltage is used as the reference voltage.

4. The method for reading a NAND-type flash memory apparatus according to claim 1, wherein a voltage of 1V or a half of the power supply voltage is used as the read voltage.

5. The method for reading a NAND-type flash memory apparatus according to claim 1, wherein a voltage of 3V to 5V which is higher than a threshold voltage of the programmed cell is used as the pass voltage.

6. The method for reading a NAND-type flash memory apparatus according to claim 1, wherein, when the selected cell is in an erased state, the read voltage applied to the selected bit line is increased by a product of a current flowing the selected cell and a determination time divided by a line capacitance.

7. The method for reading a NAND-type flash memory apparatus according to claim 1, wherein, when the selected cell is in a programmed state, the read voltage applied to the selected bit line is increased by a product of a leakage current flowing the cell connected to the selected bit line and a determination time divided by a line capacitance.

* * * * *